(12) United States Patent
Ang et al.

(10) Patent No.: US 6,610,604 B1
(45) Date of Patent: Aug. 26, 2003

(54) METHOD OF FORMING SMALL TRANSISTOR GATES BY USING SELF-ALIGNED REVERSE SPACER AS A HARD MASK

(75) Inventors: Chew-Hoe Ang, Singapore (SG); Eng-Hua Lim, Singapore (SG); Randall Cha, Singapore (SG); Jia-Zhen Zheng, Singapore (SG); Elgin Quek, Singapore (SG); Mei-Sheng Zhou, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 30 days.

(21) Appl. No.: 10/068,053

(22) Filed: Feb. 5, 2002

(51) Int. Cl.$^7$ .............................................. H01L 21/302
(52) U.S. Cl. ...................... 438/694; 438/715; 438/723; 438/724; 438/756
(58) Field of Search ................. 438/692, 694, 438/719, 723, 724, 756, 757

(56) References Cited

U.S. PATENT DOCUMENTS

| | | | |
|---|---|---|---|
| 4,648,937 A | 3/1987 | Ogura et al. | 156/643 |
| 4,729,966 A | 3/1988 | Koshino et al. | 437/39 |
| 4,784,718 A | 11/1988 | Mitani et al. | 156/643 |
| 4,931,137 A | 6/1990 | Sibuet | 156/656 |
| 5,202,272 A | 4/1993 | Hsieh et al. | 437/29 |
| 5,336,630 A | 8/1994 | Yun et al. | 437/52 |
| 6,171,937 B1 | 1/2001 | Lustig | 438/585 |
| 6,184,116 B1 * | 2/2001 | Shen et al. | 438/587 |
| 6,204,517 B1 * | 3/2001 | Wu | 257/51 |
| 6,355,528 B1 * | 3/2002 | Ishida et al. | 438/269 |
| 6,455,433 B1 * | 9/2002 | Chang et al. | 438/692 |
| 6,500,743 B1 * | 12/2002 | Lopatin et al. | 438/592 |

* cited by examiner

*Primary Examiner*—Benjamin L. Utech
*Assistant Examiner*—Binh X. Tran
(74) *Attorney, Agent, or Firm*—George O. Saile; Rosemary L.S. Pike; Stephen G. Stanton

(57) ABSTRACT

A method of forming narrow gates comprising the following steps. A substrate is provided having an overlying $Si_3N_4$ or an $SiO_2/Si_3N_4$ stack gate dielectric layer. A gate material layer is formed over the gate dielectric layer. A hard mask layer is formed over the gate material layer. The hard mask layer and the gate material layer are patterned to form a hard mask/gate material layer stack. A planarized dielectric layer is formed surrounding the hard mask/gate material layer stack. The patterned hard mask layer is removed from over the patterned gate material layer to form a cavity having exposed dielectric layer side walls. Masking spacers are formed on the exposed dielectric layer side walls over a portion of the patterned gate material layer. The patterned gate material layer is etched using the masking spacers as masks to expose a portion of the gate dielectric layer. The planarized dielectric layer is removed. The masking spacers are removed to form narrow gates comprising gate material.

30 Claims, 3 Drawing Sheets

METHOD OF FORMING SMALL TRANSISTOR GATES BY USING SELF-ALIGNED REVERSE SPACER AS A HARD MASK

FIELD OF THE INVENTION

The present invention relates generally to fabrication of semiconductor devices, and more specifically to methods of fabricating transistor gates used in semiconductor devices.

BACKGROUND OF THE INVENTION

The current practice to form small transistor gates uses increasingly smaller wavelengths of light in the lithography step(s). The current practice places increasingly stringent requirements on lithography.

U.S. Pat. No. 4,784,718 to Mitani et al. describes a method for fabricating a semiconductor device with its gate electrode and source/drain extraction electrodes being made of the same material on a GaAs substrate and with its source/drain heavily doped regions self-aligned with both gate electrode and source/drain extraction electrodes.

U.S. Pat. No. 5,202,272 to Hsieh et al. describes a method of forming a field effect-transistor formed with a deep-submicron gate.

U.S. Pat. No. 4,931,137 to Sibuet describes a process for fabricating conductor elements on a substrate mutually spaced by a submicron dimension.

U.S. Pat. No. 4,729,966 to Koshino et al. describes a process for fabricating a Schottky FET device using metal sidewalls as gates.

U.S. Pat. No. 4,648,937 to Ogura et al. describes a method of preventing asymmetric etching of lines in sub-micrometer range sidewall images transfer.

U.S. Pat. No. 6,171,937 to Lustig describes a process for fabricating an MOS transistor having a channel length of less than 100 nm.

U.S. Pat. No. 5,336,630 to Yun et al. describes a method of making a semiconductor memory device having a storage node with a plurality of pillars capable of increasing the storage node surface and thus the cell capacitance.

SUMMARY OF THE INVENTION

Accordingly, it is an object of the present invention to provide an improved method of fabricating small transistor gates.

Another object of the present invention to provide an improved method of fabricating small transistor gates that relies less on lithography than conventional methods.

Other Objects Will Appear Hereinafter.

It has now been discovered that the above and other objects of the present invention may be accomplished in the following manner. Specifically, a substrate is provided having an overlying $Si_3N_4$ or an $SiO_2/Si_3N_4$ stack gate dielectric layer. A gate material layer is formed over the gate dielectric layer. A hard mask layer is formed over the gate material layer. The hard mask layer and the gate material layer are patterned to form a hard mask/gate material layer stack. A planarized dielectric layer is formed surrounding the hard mask/gate material layer stack. The patterned hard mask layer is removed from over the patterned gate material layer to form a cavity having exposed dielectric layer side walls. Masking spacers are formed on the exposed dielectric layer side walls over a portion of the patterned gate material layer. The patterned gate material layer is etched using the masking spacers as masks to expose a portion of the gate dielectric layer. The planarized dielectric layer is removed. The masking spacers are removed to form narrow gates comprising gate material.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Initial Structure

Figure 1:
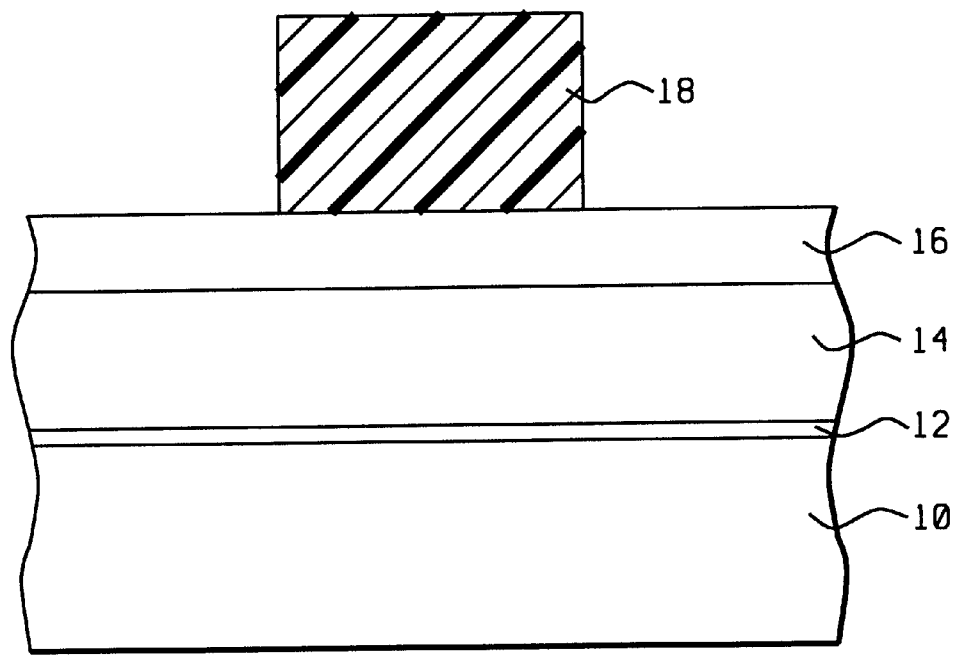
FIGS. 1 to 6 schematically illustrate in cross-sectional representation a preferred embodiment of the present invention.

FIG. 1 illustrates a cross-sectional view of a wafer 10, preferably a semiconductor wafer, having an $Si_3N_4$ or $SiO_2/Si_3N_4$ stack gate dielectric layer 12 formed thereover to a thickness of preferably from about 15 to 100 Å and more preferably from about 15 to 28 Å. $Si_3N_4$ or $SiO_2/Si_3N_4$ stack gate dielectric layer 12 is preferably deposited over wafer 10 and is more preferably is comprised of an $SiO_2/Si_3N_4$ stack as will be used for illustrative purposes hereafter.

Gate material 14 is deposited over $SiO_2/Si_3N_4$ stack gate dielectric layer 12 to a thickness of preferably from about 900 to 2000 Å and more preferably from about 1200 to 1600 Å. Gate material 14 is preferably comprised of polysilicon (poly), W on TiN stack or TaN and is more preferably comprised of poly.

Hard mask layer 16 may then be formed over gate material 14 to a thickness of from about 900 to 2000 Å and more preferably from about 1200 to 1600 Å. Hard mask layer 16 is preferably formed of nitride, silicon nitride ($Si_3N_4$) or silicon oxynitride (SiON) and is more preferably formed of silicon nitride.

Patterning of Gate Material 14

Figure 2:
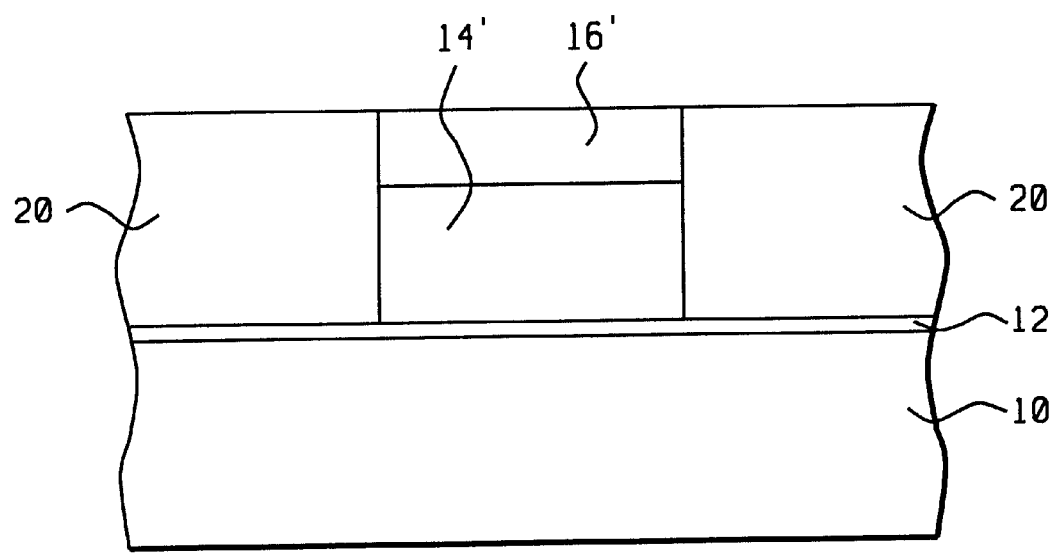

As shown in FIG. 2, gate material 14 is then patterned to form patterned gate material 14' having a width of preferably from about 1800 to 3200 Å and more preferably from about 1800 to 2400 Å.

Gate material 14 may be patterned as shown in FIGS. 1 and 2 to form patterned gate material 14', that is patterned photoresist layer 18 may be formed over hard mask layer 16 as shown in FIG. 1. As shown in FIG. 2, hard mask layer 16 may then be patterned using patterned photoresist layer 18 during an etch process to form patterned hard mask layer 16'. Photoresist layer 18 would then be stripped and gate material 14 patterned to form patterned gate material 14' using patterned hard mask layer 16' as a mask. If it is desired to minimize loss of the hard mask layer 16' during etching of the gate material 14, photoresist layer 18 is not stripped until after the patterned gate material 14' is formed. The thickness of the patterned hard mask layer 16' determines the thickness of the resist spacers 24 to be formed later (see below).

Deposition of Dielectric Layer 20

As shown in FIG. 2, dielectric layer 20 is then deposited over the structure and planarized to fill in the gaps between adjacent patterned hard mask 16'/patterned gate material 14' stacks. Dielectric layer 20 is planarized using patterned hard mask layer 16' as a polish stop. Dielectric layer 20 is preferably planarized using chemical mechanical polishing (CMP).

Dielectric layer 20 is preferably high-density plasma (HDP) oxide, PECVD oxide, LPCVD oxide or SABPSG and is more preferably HDP oxide as that provides for better gap fill between the gates.

Formation of Spacers 24

Figure 3:
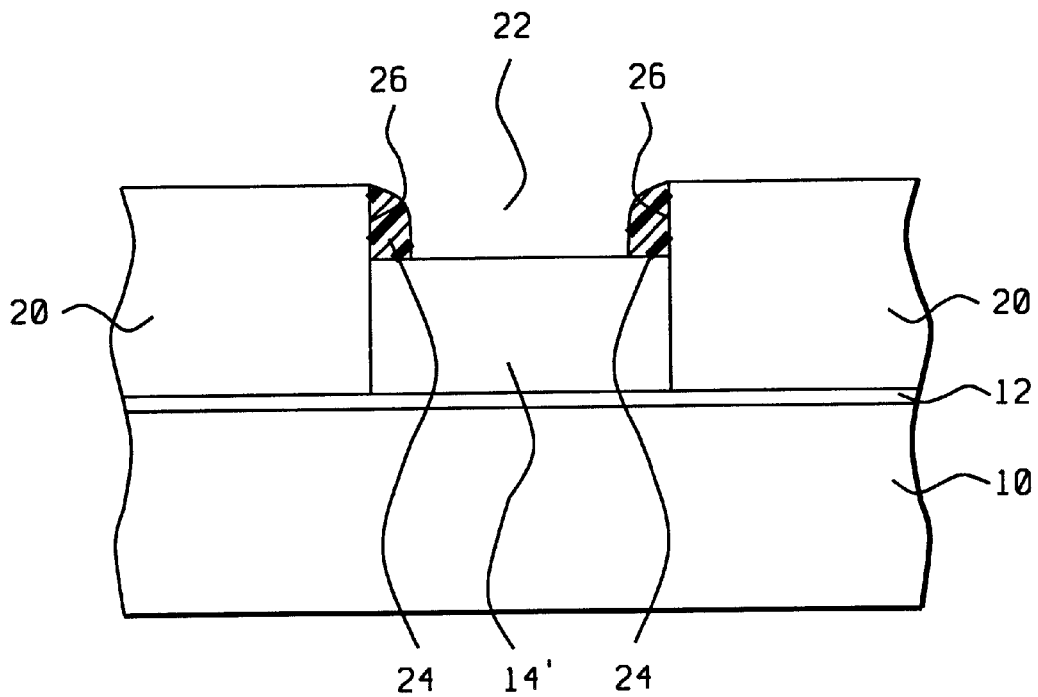

As shown in FIG. 3, patterned hard mask layer 16' is removed, preferably by wet stripping or dry selective etching and more preferably wet stripping to form cavity 22. Cavity 22 has exposed side walls 26.

A thin layer of spacer material is deposited over the structure, filling cavity 22, and is then etched, preferably by a blanket etch, to form self-aligned spacers 24 over exposed side walls 26 of cavity 22. Spacers 24 are preferably comprised of photoresist.

Etching of Patterned Gate Material 14'

Figure 4:
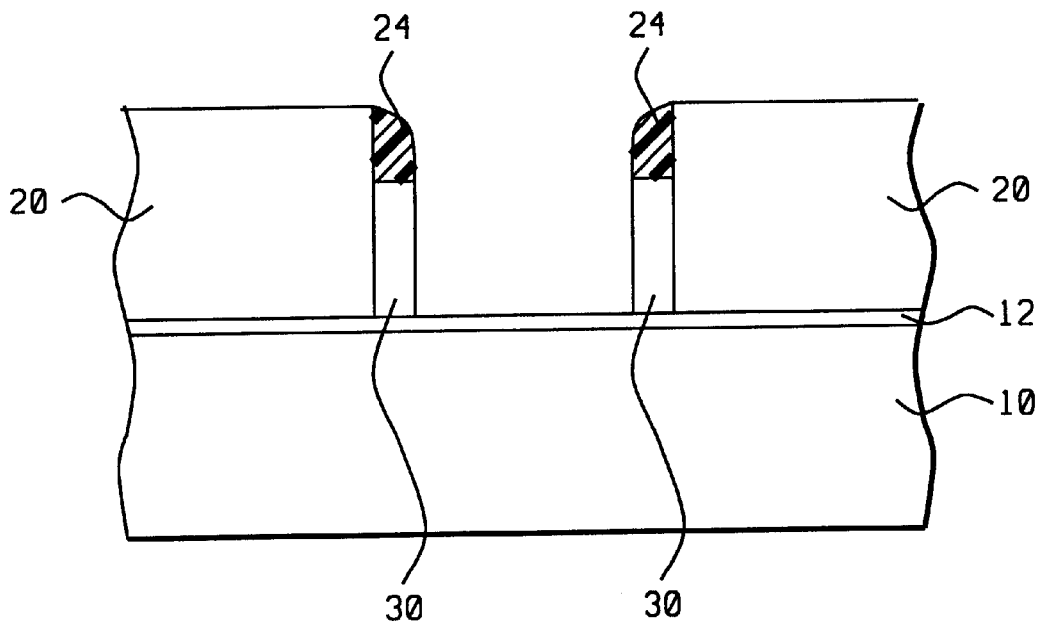

As shown in FIG. 4, patterned gate material 14' is etched using spacers 24 as masks to form small transistor gate electrodes 30. Small gate-electrodes 30 have a width of preferably from about 250 to 800 Å and more preferably from about 250 to 500 Å. It is noted that $SiO_2/Si_3N_4$ stack gate dielectric layer 12 between gate electrodes 30 are also partially etched.

It is noted that small, narrow transistor gate electrodes 30 are formed in accordance with the method of the present invention with less reliance upon lithography to form the small, narrow gate electrodes 30. Instead the width of masking spacers 24 determines the width of small, narrow transistor gate electrodes 30 which are in turn formed by a blanket etch, without direct reliance upon lithography.

Removal of Dielectric Layer 20

Figure 5:
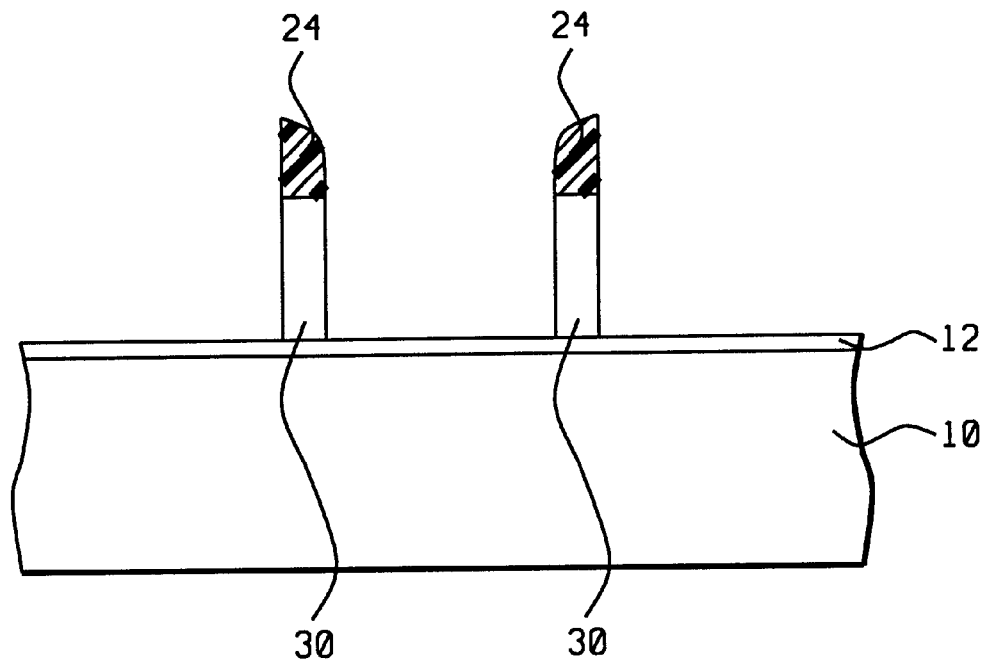

As shown in FIG. 5, planarized dielectric layer 20 is removed, preferably by an oxide dip.

Removal of Masking Spacers 24

Figure 6:
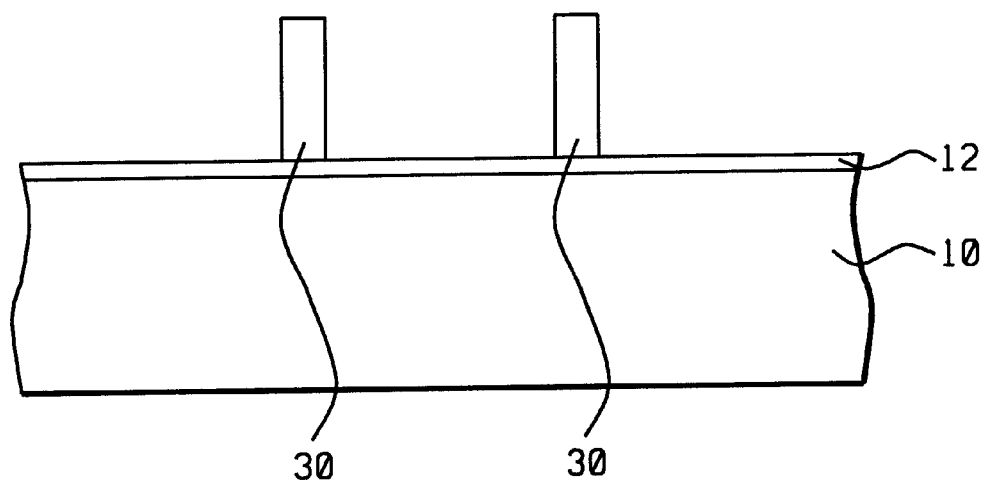

As shown in FIG. 6, masking spacers 24 are preferably removed by a resist ashing process, leaving small, narrow gate electrodes 30.

Any unwanted connections between adjacent small, narrow gate electrodes 30 are etched off after appropriate masking.

Advantages of the Invention

The advantages of the present invention include:

1); non-reliance on very advanced lithography performance; and 2) deposition and etch-dependent poly critical dimensions are more controllable than lithography.

While particular embodiments of the present invention have been illustrated and described, it is not intended to limit the invention, except as defined by the following claims.

We claim:

1. A method of forming narrow gates, comprising the steps of:
    providing a substrate having an overlying gate dielectric layer;
    forming a gate material layer over the gate dielectric layer;
    forming a hard mask layer over the gate material layer;
    patterning the hard mask layer and the gate material layer to form a hard mask/gate material layer stack;
    forming a planarized dielectric layer surrounding the hard mask/gate material layer stack;
    removing the patterned hard mask layer from over the patterned gate material layer to form a cavity having exposed dielectric layer side walls;
    forming masking spacers on the exposed dielectric layer side walls over a portion of the patterned gate material layer;
    etching the patterned gate material layer using the masking spacers as masks to expose a portion of the gate dielectric layer;
    removing the planarized dielectric layer; and
    removing masking spacers to form narrow gates comprising gate material.

2. The method of claim 1, wherein the gate dielectric layer is from about 15 to 100 Å thick; the gate material layer is from about 900 to 2000 Å thick; and the hard mask layer is from about 900 to 2000 Å thick.

3. The method of claim 1, wherein the gate dielectric layer is from about 15 to 28 Å thick; the gate material layer is from about 1200 to 1600 Å thick; and the hard mask layer is from about 1200 to 1600 Å thick.

4. The method of claim 1, wherein the gate dielectric layer is comprised of a material selected from the group consisting of $Si_3N_4$ and $SiO_2/Si_3N_4$ stack; the gate material layer is comprised of a material selected from the group consisting of poly, W on TiN stack and TaN; and the hard mask layer is comprised of a material selected from the group consisting of nitride, silicon nitride and silicon oxynitride.

5. The method of claim 1, wherein the gate dielectric layer is comprised of an $SiO_2/Si_3N_4$ stack; the gate material layer is comprised of poly; and the hard mask layer is comprised of silicon nitride.

6. The method of claim 1, wherein the hard mask/gate material layer stack is from about 1800 to 3200 Å wide.

7. The method of claim 1, wherein the hard mask/gate material layer stack is from about 1800 to 2400 Å wide.

8. The method of claim 1, wherein the masking spacers have a base width of from about 250 to 800 Å and the narrow gates are from about 250 to 800 Å wide.

9. The method of claim 1, wherein the masking spacers have a base width of from about 250 to 500 Å and the narrow gates are from about 250 to 500 Å wide.

10. The method of claim 1 wherein the planarized dielectric layer is removed by an oxide dip.

11. The method of claim 1, including the step of etching away any connections between narrow gates.

12. A method of forming narrow gates, comprising the steps of:
    providing a substrate having an overlying gate dielectric layer; the gate dielectric layer is comprised of a material selected from the group consisting of $Si_3N_4$ and $SiO_2/Si_3N_4$ stack;
    forming a gate material layer over the gate dielectric layer; the gate material layer is comprised of a material selected from the group consisting of poly, W on TiN stack and TaN;
    forming a hard mask layer over the gate material layer; the hard mask layer is comprised of a material selected from the group consisting of nitride, silicon nitride and silicon oxynitride;
    patterning the hard mask layer and the gate material layer to form a hard mask/gate material layer stack;
    forming a planarized dielectric layer surrounding the hard mask/gate material layer stack;
    removing the patterned hard mask layer from over the patterned gate material layer to form a cavity having exposed dielectric layer side walls;
    forming masking spacers on the exposed dielectric layer side walls over a portion of the patterned gate material layer;

etching the patterned gate material layer using the masking spacers as masks to expose a portion of the gate dielectric layer;

removing the planarized dielectric layer; and removing masking spacers to form narrow gates comprising gate material.

13. The method of claim 12, wherein the gate dielectric layer is from about 15 to 100 Å thick; the gate material layer is from about 900 to 2000 Å thick; and the hard mask layer is from about 900 to 2000 Å thick.

14. The method of claim 12, wherein the gate dielectric layer is from about 15 to 28 Å thick; the gate material layer is from about 1200 to 1600 Å thick; and the hard mask layer is from about 1200 to 1600 Å thick.

15. The method of claim 12, wherein the gate dielectric layer is comprised of an $SiO_2/Si_3N_4$ stack; the gate material layer is comprised of poly; and the hard mask layer 16 is comprised of silicon nitride.

16. The method of claim 12, wherein the hard mask/gate material layer stack is from about 1800 to 3200 Å wide.

17. The method of claim 12, wherein the hard mask/gate material layer stack is from about 1800 to 2400 Å wide.

18. The method of claim 12, wherein the masking spacers have a base width of from about 250 to 800 Å and the narrow gates are from about 250 to 800 Å wide.

19. The method of claim 12, wherein the masking spacers have a base width of from about 250 to 500 Å and the narrow gates are from about 250 to 500 Å wide.

20. The method of claim 12, wherein the planarized dielectric layer is removed by an oxide dip.

21. The method of claim 12, including the step of etching away any connections between narrow gates.

22. A method of forming narrow gates, comprising the steps of:

providing a substrate having an overlying gate dielectric layer; the gate dielectric layer is comprised of a material selected from the group consisting of $Si_3N_4$ and $SiO_2/Si_3N_4$ stack; the gate dielectric layer being from about 15 to 100 Å thick;

forming a gate material layer over the gate dielectric layer; the gate material layer is comprised of a material selected from the group consisting of poly, W on TiN stack and TaN; the gate material layer being from about 900 to 2000 Å thick;

forming a hard mask layer over the gate material layer; the hard mask layer is comprised of a material selected from the group consisting of nitride, silicon nitride and silicon oxynitride; the hard mask layer is from about 900 to 2000 Å thick;

patterning the hard mask layer and the gate material layer to form a hard mask/gate material layer stack;

forming a planarized dielectric layer surrounding the hard mask/gate material layer stack;

removing the patterned hard mask layer from over the patterned gate material layer to form a cavity having exposed dielectric layer side walls;

forming masking spacers on the exposed dielectric layer side walls over a portion of the patterned gate material layer;

etching the patterned gate material layer using the masking spacers as masks to expose a portion of the gate dielectric layer;

removing the planarized dielectric layer; and removing masking spacers to form narrow gates comprising gate material.

23. The method of claim 22, wherein the gate dielectric layer is from about 15 to 28 Å thick; the gate material layer is from about 1200 to 1600 Å thick; and the hard mask layer is from about 1200 to 1600 Å thick.

24. The method of claim 22, wherein the gate dielectric layer is comprised of an $SiO_2/Si_3N_4$ stack; the gate material layer is comprised of poly; and the hard mask layer 16 is comprised of silicon nitride.

25. The method of claim 22, wherein the hard mask/gate material layer stack is from about 1800 to 3200 Å wide.

26. The method of claim 22, wherein the hard mask/gate material layer stack is from about 1800 to 2400 Å wide.

27. The method of claim 22, wherein the masking spacers have a base width of from about 250 to 800 Å and the narrow gates are from about 250 to 800 Å wide.

28. The method of claim 22, wherein the masking spacers have a base width of from about 250 to 500 Å and the narrow gates are from about 250 to 500 Å wide.

29. The method of claim 22, wherein the planarized dielectric layer is removed by an oxide dip.

30. The method of claim 22, including the step of etching away any connections between narrow gates.

* * * * *